United States Patent
Pullini et al.

(10) Patent No.: US 8,012,771 B2
(45) Date of Patent: Sep. 6, 2011

(54) METHOD FOR MANUFACTURING MAGNETIC FIELD DETECTION DEVICES AND DEVICES THEREFROM

(75) Inventors: Daniele Pullini, Orbassano (IT); Brunetto Martorana, Orbassano (IT); Piero Perlo, Sommariva Bosco (Cuneo) (IT)

(73) Assignee: C.R.F. Societa Consortile per Azioni, Orbassano (Torino) (IT)

( * ) Notice: Subject to any disclaimer, the term of this patent is extended or adjusted under 35 U.S.C. 154(b) by 0 days.

(21) Appl. No.: 12/926,284

(22) Filed: Nov. 8, 2010

(65) Prior Publication Data
US 2011/0101477 A1    May 5, 2011

Related U.S. Application Data

(62) Division of application No. 10/566,838, filed as application No. PCT/IB2004/002543 on Jul. 30, 2004, now Pat. No. 7,829,962.

(30) Foreign Application Priority Data

Aug. 5, 2003 (IT) ................................. TO03A0604
Aug. 5, 2003 (IT) ................................. TO03A0605
Sep. 23, 2003 (IT) ................................. TO03A0727

(51) Int. Cl.
*H01L 43/10* (2006.01)
*H01L 29/82* (2006.01)

(52) U.S. Cl. ............ 438/3; 257/421; 365/157; 360/313; 360/324

(58) Field of Classification Search ...... 257/2, 421–427; 360/324–326; 438/3; 365/157–158
See application file for complete search history.

(56) References Cited

U.S. PATENT DOCUMENTS
2002/0054461 A1 * 5/2002 Fujiwara et al. ........... 360/324.1
* cited by examiner

*Primary Examiner* — Jami M Valentine
(74) *Attorney, Agent, or Firm* — Nixon & Vanderhye P.C.

(57) ABSTRACT

A method for manufacturing magnetic field detection devices comprises the operations of manufacturing a magneto-resistive element comprising regions with metallic conduction and regions with semi-conductive conduction. The method comprises the following operations: forming metallic nano-particles to obtain regions with metallic conduction; providing a semiconductor substrate; and applying metallic nano-particles to the porous semiconductor substrate to obtain a disordered mesoscopic structure. A magnetic device comprises a spin valve, which comprises a plurality of layers arranged in a stack which in turn comprises at least one free magnetic layer able to be associated to a temporary magnetisation (MT), a spacer layer and a permanent magnetic layer associated to a permanent magnetisation (MP). The spacer element is obtained by means of a mesoscopic structure of nanoparticles in a metallic matrix produced in accordance with the inventive method for manufacturing magneto-resistive elements.

16 Claims, 6 Drawing Sheets

METHOD FOR MANUFACTURING MAGNETIC FIELD DETECTION DEVICES AND DEVICES THEREFROM

This application is a divisional application from U.S. patent application Ser. No. 10/566,838, filed Feb. 2, 2006, now U.S. Pat. No. 7,829,962 which is the US national phase of international application PCT/IB2004/002543, filed 30 Jul. 2004, which designated the U.S. and claims benefit of IT TO2003A000604 dated 5 Aug. 2003, IT TO2003A000605 dated 5 Aug. 2003, and IT TO2003A000727 dated 23 Sep. 2003, the entire contents of all the foregoing of which are hereby incorporated by reference.

The present invention relates to a method for manufacturing magnetic field detection devices, said method comprising the operations of manufacturing a magneto-resistive element comprising regions with metallic conduction and regions with semiconductive conduction.

According to the state of the art, to detect magnetic fields, magnetoresistive sensors are employed, i.e. devices whose resistance to the passage of the electrical current varies with variations in the magnetic field whereto they are subjected. In particular, magnetic sensors called AMR (Anisotropic Magneto Resistance) are known; they are usually obtained by means of a thin film of iron-nickel (permalloy), deposited onto a silicon wafer and shaped in the form of a resistive strip.

The application of an external magnetic field determines a change in the orientation of magnetisation in the permalloy, making its magnetisation not parallel to the current that flows in the resistive strip and thereby increasing resistance. Said AMR sensors change their resistance by 2-3% in the presence of magnetic fields. In order effectively to appreciate the change in resistance, the AMR sensors are thus laid in such a way as to form a Wheatstone bridge.

However, the change in resistance is linked to the occurrence of the magneto-resistive effect, present in a limited quantity of materials similar to permalloy.

Figure 1:
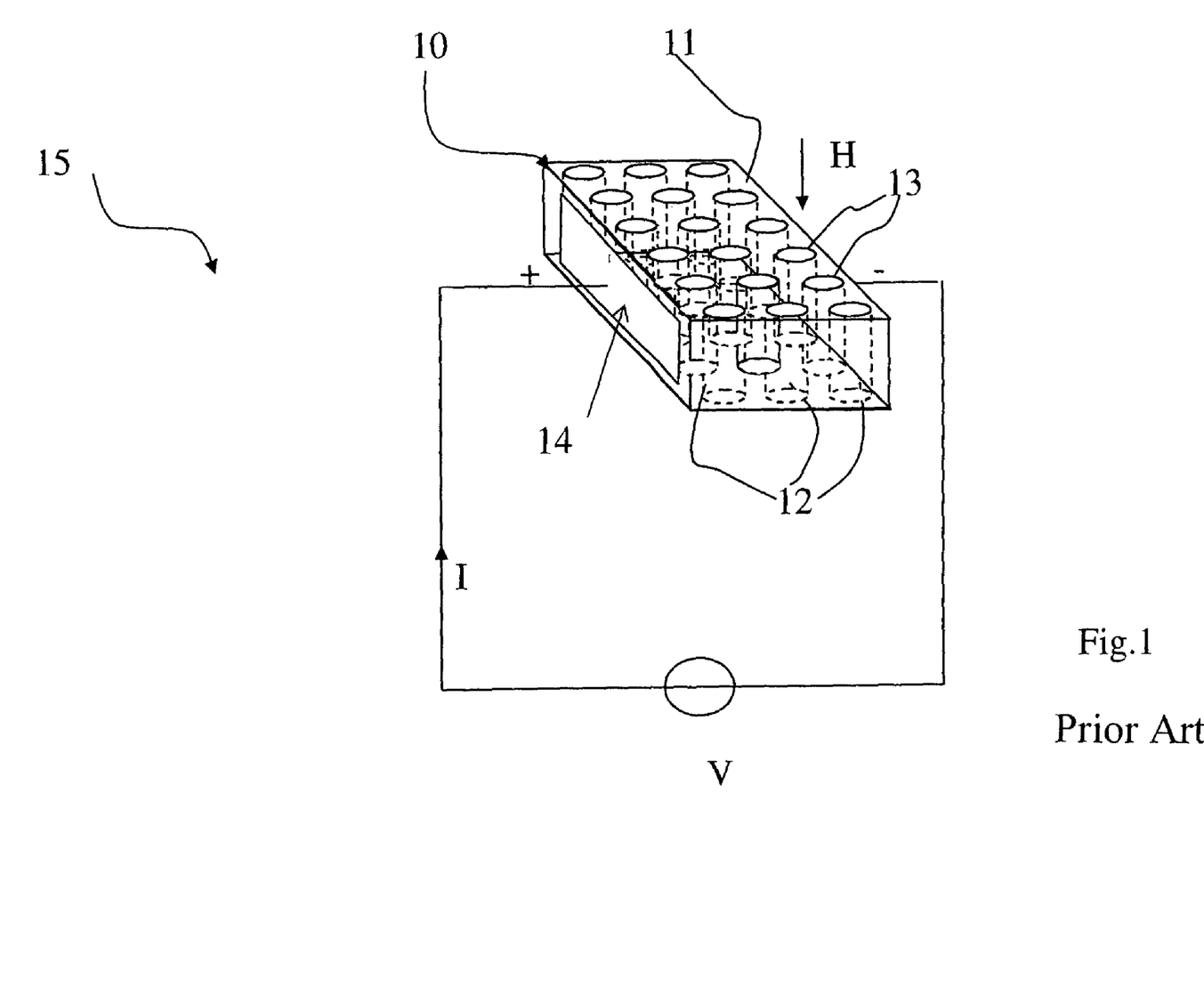
FIG. 1 shows a schematic diagram of a magnetic field detection device.

Moreover, such sensors are not easy to integrate and miniaturise. U.S. Pat. No. 6,353,317 teaches using a porous semiconductor structure to create nanowires or nanotubes, which are subsequently filled with magnetic material. FIG. 1 shows a magneto-resistive element 10, comprised in a device for detecting magnetic fields, globally designated by the reference 15, obtained by depositing a metal into the pores of a porous semiconductor. Said magnetoresistive element 10 comprises a semiconductor substrate 11, in which are present pores 12. Inside the pores 12 are present cylinders 13 made of metallic material. To the semiconductor substrate 11 are applied lateral electrodes 14. The semiconductor substrate 11 is constituted by a high mobility semiconductor, e.g. InAs. The operation of the device 15 is as follows.

To the lateral electrodes 14 is applied a voltage V able to determine a current I, which flows between the electrodes 14 and whose value is determined by the resistance of the magnetoresistive element 10. Said resistance is substantially due to the current flows through the metallic cylinders 13, whose resistance is lower.

In the presence of an external magnetic field H, in the cylinders 13, due to Lorentz' force, a spatial charge distribution is achieved that determines an electrical field tending to exclude the passage of current inside them. Therefore, the value of the current I that flows in the magnetoresistive element 10 is determined by the resistance of the semiconductor substrate 11, which is higher. Moreover, in it the electronic paths are more tortuous and longer and this contributes to the resistance increase in the magnetoresistive element 10. Therefore, the detecting device 15 allows to detect a magnetic field H by means of the sudden change, in particular the sudden increase in the resistance of the magnetoresistive element 10 in the presence of the magnetic field H.

The porous semiconductor material that constitutes the substrate 11 is produced by means of a reactive ion etching technique applied to a semiconductor wafer, whilst the metal that constitutes the cylinders 13 in the pores 12 is deposited by means of an electrical deposition method.

However, such a procedure is quite complex and costly, involving a reactive ion etching process for the creation of conducting islands in the semiconductor.

The object of the present invention is to provide a solution enabling to manufacture a magnetic field detection device comprising regions with metallic conduction and regions with semiconductive conduction in simple and economical fashion.

According to the present invention, said object is achieved thanks to a method having the characteristics specifically recalled in the claims that follow.

The invention shall now be described with reference to the accompanying drawings, provided purely by way of non limiting example, in which.

The idea constituting the basis for the method according to the invention is to obtain the magnetoresistive element of the magnetic field detection device with a disordered mesoscopic structure of metallic nanoparticles in a semiconductor substrate with high mobility and narrow band gap.

Figure 2A:
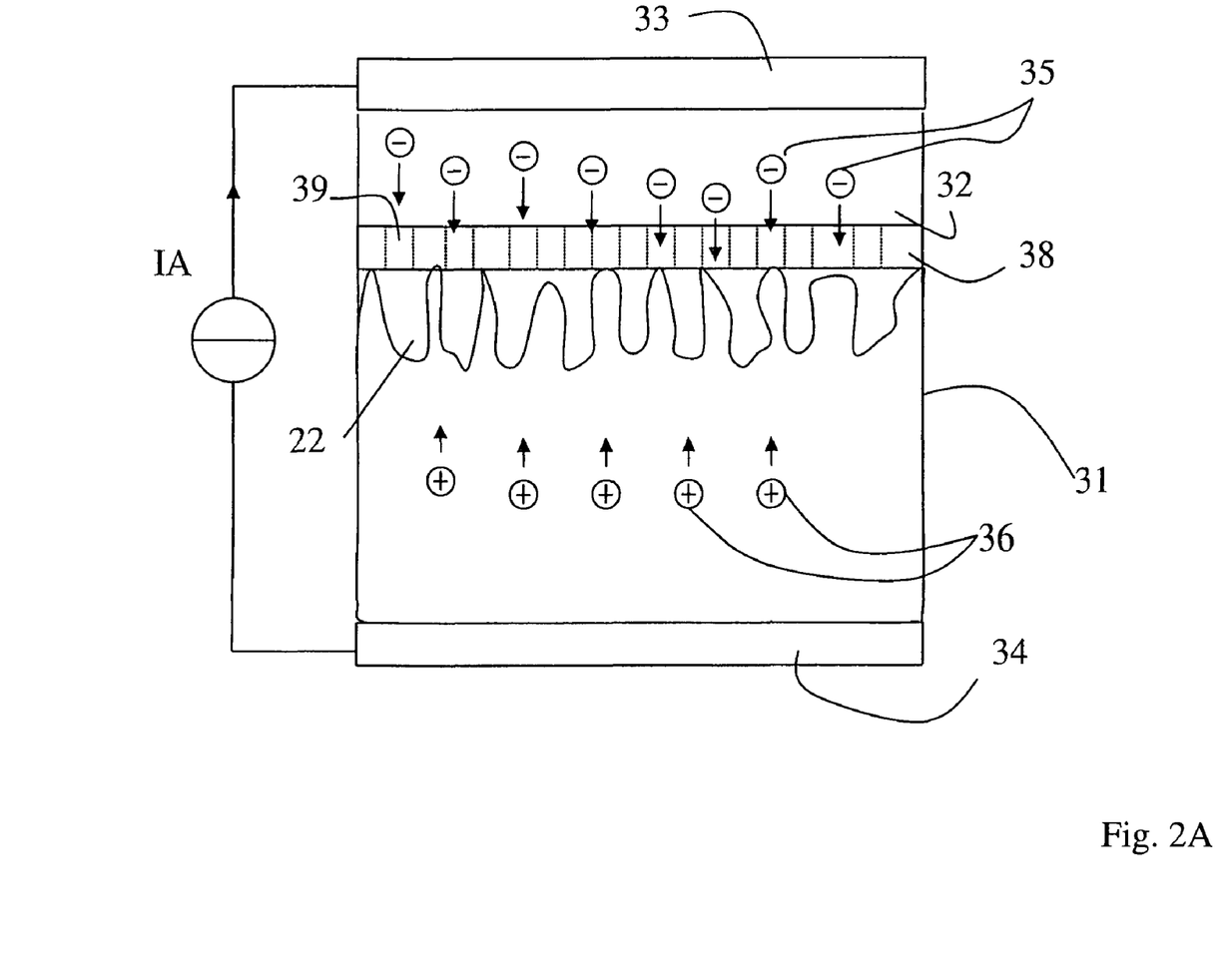
FIGS. 2A, 2B and 2C show steps of a method for manufacturing a device for detecting magnetic fields according to the invention.
Figure 2B:
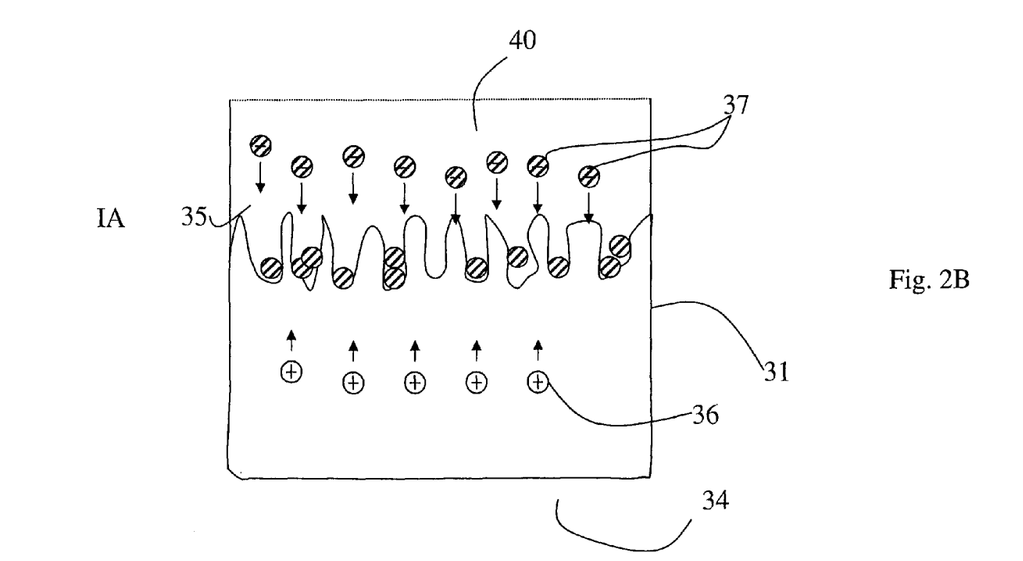
Figure 2C:
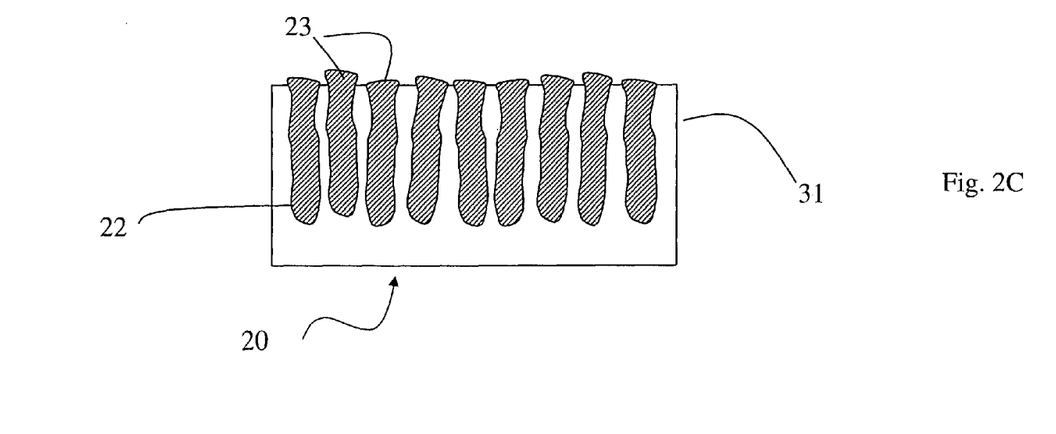

With reference to FIGS. 2A, 2B and 2C, therefore, a method is proposed for manufacturing a magnetoresistive element 20 with similar purposes and operation to the magnetoresistive element 10, shown in FIG. 1. Said method in a first step entails preparing nanoparticles or clusters of metallic material, through a process of synthesising metallic colloids or another known process for synthesising metallic nanoparticles. Said nano-metallic particles, designated by the reference 37 in FIG. 2B, alternatively, are also available on the market and can be simply bought.

In a second step of the proposed manufacturing method, said metal nanoparticles are inserted together with an appropriate solvent in a solution 40. The solvent can be, by way of example, glycol or acetone.

A third step of the proposed method provides for rendering porous a substrate of semiconductor material 31. In a preferred version, a template 38 made of anodised alumina is applied to serve as a template on the surface of the semiconductor substrate 31. Said anodised alumina template 38 is provided, by virtue of the anodisation process whereto it was subjected, with nanometric pores 39, so it is possible to execute simultaneously spatially selective acid etchings, in particular by means of an electrochemical etching, through the pores 39 of the anodised aluminium template 38.

In particular, a current IA is made to pass through an acid electrolytic solution 32 between said semiconductor substrate 31, provided with a rear contact 34 which constitutes the anode, and a platinum filament 33 which constitutes the cathode. In the solution, the charge can only be transported if at the electrolyte/semiconductor interface there is a passage of charge between an ion of the electrolytic solution 32, designated by the reference 35 in FIG. 2A, and positive ions 36 of the silicon substrate 31. This takes place by means of a chemical reaction that dissolves the anode, in the specific case the semiconductor substrate 31. As a consequence thereof pores 22 are developed in depth in the substrate 31 dissolving it partially.

In a preferred version of the method said acid etching is performed until obtaining pores 22 passing through the entire volume of the semiconductor substrate 31.

It is also possible to use other nano-porous templates instead of alumina, such as polymethylmethylacrylate (PMMA) or polymides.

A fourth step of the method, illustrated in FIG. 2b, then provides for applying said solution 40 containing metallic nanoparticles 37 to the semiconductor substrate 31, now rendered porous, through a precipitation or capillary condensation process. The metallic nanoparticles 37 penetrate by capillarity into the pores of the nano-porous matrix, whilst the liquid fraction of the solution evaporates, giving rise to a capillary condensation process.

Alternatively, instead of capillary precipitation or condensation, an electrochemical plating method can be used to deposit the metallic nanoparticles 37 into the pores 22.

In a fifth step a thermal annealing process is then performed to melt or aggregate said metallic nanoparticles in a column structure or nanorod 23, shown in FIG. 2C, and lower their resistance, obtaining a magnetoresistive element 20 constituted by a porous semiconductor matrix with pores 22 filled with metallic material.

According to a further inventive aspect of the proposed method, the replacement of the electrolytic solution 32 in the third step with the solution 40 containing the metallic nanoparticles 37 occurs progressively without uncovering the surface of the substrate 31, i.e. leaving a sufficient layer of electrolyte 32 to cover the pores 22, and hence to prevent air or ambient gas from penetrating therein. This would make it difficult for the metallic nanoparticles 37 to achieve deep penetration.

Subsequently, in a step not shown in the figures, then, the magnetoresistive element 20 is provided with lateral contacts, similar to those shown in FIG. 1, by means of a metallic evaporation process.

The metallic nanoparticles can be made of any metal such as gold, silver, aluminium, gallium, indium, copper, chrome, tin, nickel, iron, platinum, palladium, cobalt, tungsten, molybdenum, tantalum, titanium, permalloy, as well as of other ferromagnetic alloys or other alloys with substantially metallic conduction.

The semiconductor substrate 31 can be laid onto any other insulating substrate, e.g. silicon or glass, by the most disparate methods, such as continuous or pulsed electrical deposition, electrochemical methods, simple precipitation, centrifuging, thermal evaporation or electron beam, simple or magnetron sputtering, CVD, PECVD, serigraphy.

A spin valve device which employs the manufacturing method described above shall now be described.

In the sector of magnetic field sensors, magnetic devices are known which use the so-called 'spin valves'. A spin valve is a device generally constituted by a succession of layers of different materials.

Figure 3:
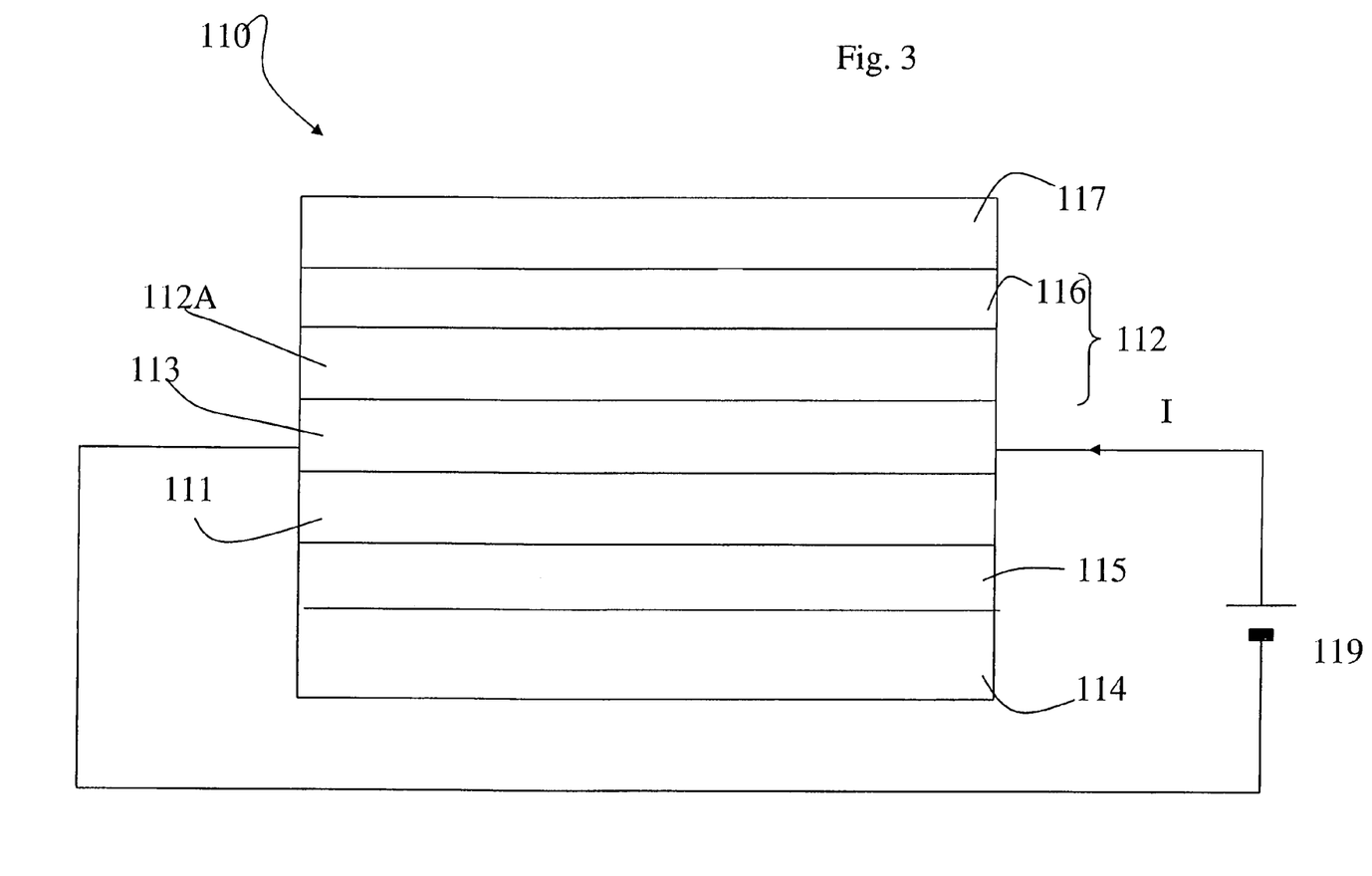
FIG. 3 shows a schematic diagram of a spin valve magnetic device manufactured according to the manufacturing method of the invention.

The structure of a spin valve magnetic device 110 according to the invention is shown schematically in FIG. 3. Said spin valve 110 comprises a plurality of stacked layers of different materials. This plurality of layers comprises, in particular, a substrate 114, for example a glass substrate, whereon is laid a growth layer 115, also called seed layer, obtained for example with a layer of tantalum, which acts as a seed for the growth of a permanent magnetic layer112. The free magnetic layer 111 is constituted by a soft magnetic material, such as an iron-nickel alloy, like permalloy, provided with a non permanent magnetisation. Said free magnetic layer 111 serves the purpose of orienting its magnetisation following the external magnetic field to be measured. Superiorly to the free magnetic layer 111 is placed a non ferromagnetic spacer layer 113.

On the spacer layer 113 is laid a permanent magnetic layer 112. In FIG. 3, said permanent magnetic layer 112 is shown comprising two layers, a pinned magnetic layer 112A, also called 'pinned layer' and a pinning antiferromagnetic layer 116, also called 'pinning layer'. The antiferromagnetic layer 116 produces a short radius magnetic field that influences and pins the magnetisation of the pinned layer 112A, which can no longer follow an external magnetic field. The set of the layers 112A and 116 behaves in fact as a permanent magnet with high magnetic coercivity and provides a reference field to the spin valve 110.

The permanent magnetic field 112 can alternatively be obtained by the simple laying of a single hard magnetic layer, for example a layer of cobalt.

The antiferromagnetic layer 116 of the spin valve 110 is obtained, for example, by means of a NiMn alloy. Said antiferromagnetic layer 116 is then coated by a passivating layer 117, also made of tantalum.

The spin valve 110 shown in FIG. 3 is of the CIP (current in plane) type, i.e. to the spin valve, by means of a generator 119, is applied a current I that flows in planar fashion in the spacer layer 113 and in the other layers of the spin valve110. The spacer layer 113 then is the layer that contributes most to determine the electrical resistance of the spin valve 110 in the absence of a magnetic field. It is also possible to have a CPP configuration (Current Perpendicular to Plane), in which the current I is forced to traverse vertically the stacked layers of the spin valve.

Figure 4A:
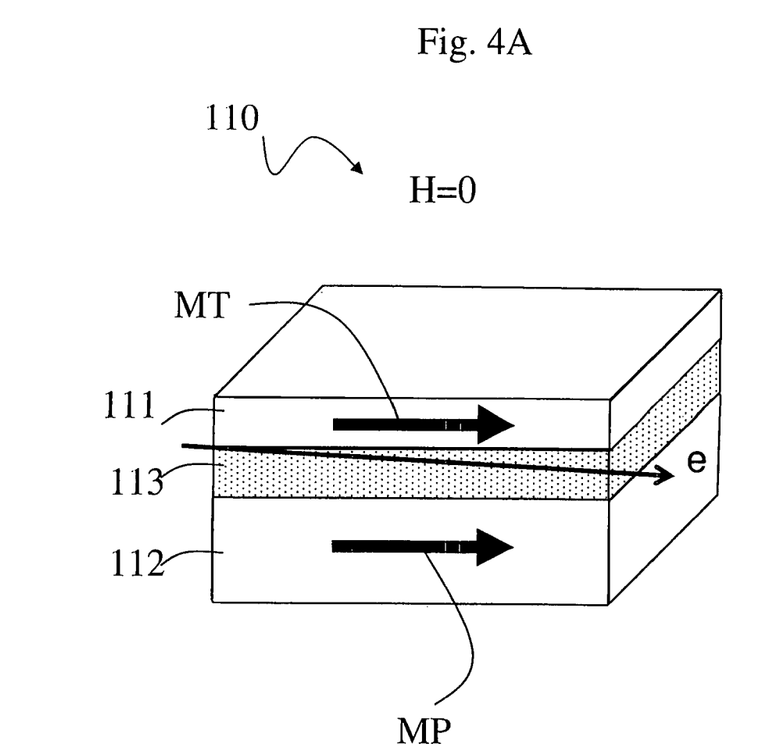
FIGS. 4A and 4B show, in diagram form, two different operating states of the device of FIG. 3.

In the absence of an external magnetic field, the spin valve shown in FIG. 3 is in ferromagnetic configuration, i.e. the free magnetic layer 111 and the permanent magnetic layer 112 have the same direction of magnetisation. In the figures, the direction of the temporary magnetisation associated with the free magnetic layer 111 is indicated with an arrow and the reference MT, whilst the direction of the permanent magnetisation associated with the permanent magnetic layer 112 is indicated with an arrow and the reference MP. Thus in this case the spin valve 110 has high electrical conductivity, since the path of the electrons, designated by the reference "e" in FIG. 4 undergoes substantially no scattering inside the spin valve device 110.

Figure 4B:
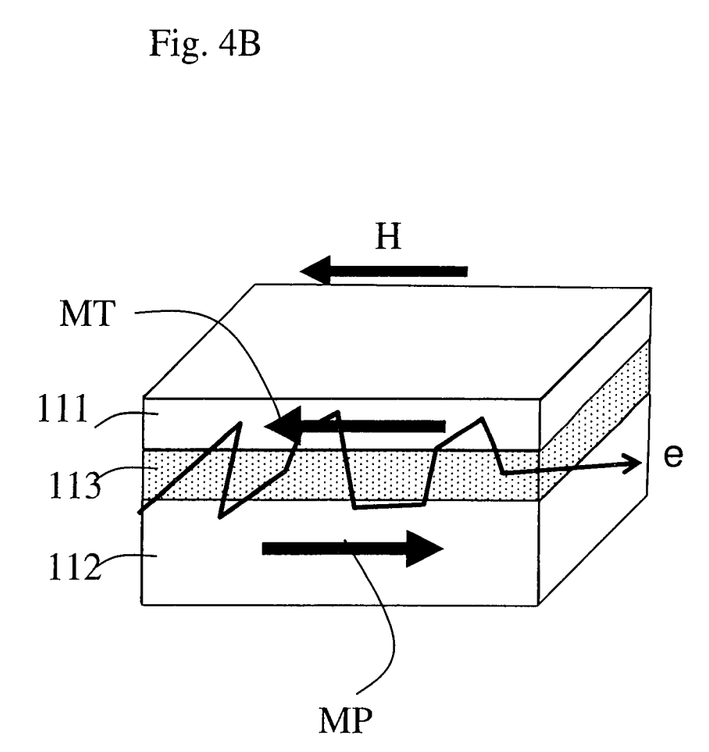

In the presence of an external magnetic field H whose direction is opposite to the reference magnetic field of the spin valve 110, as shown in FIG. 4B, which is given by the permanent magnetic field 112, the spin valve is in anti-ferromagnetic configuration and it has low electrical conductivity. As shown in FIG. 4B, the path "e" of the electrons in the spacer layer 113 and in the spin valve is subjected to a considerable scattering phenomenon.

Figure 5:
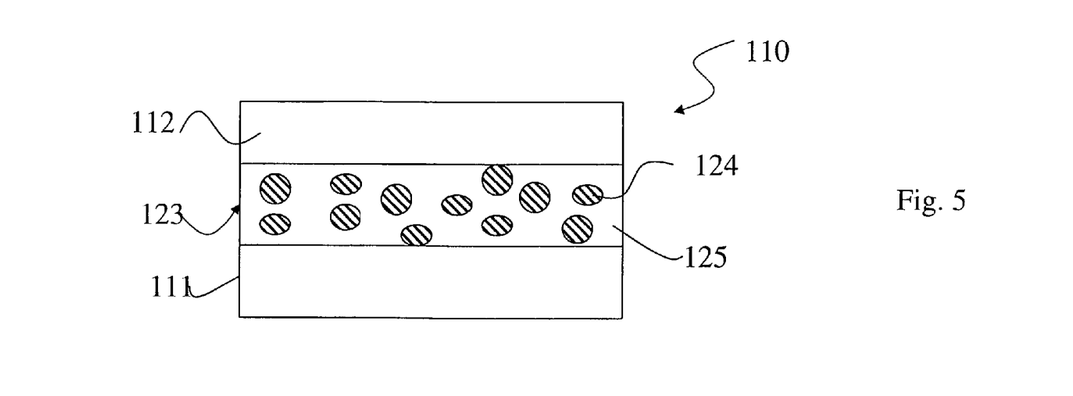
FIG. 5 shows a schematic diagram of a spin valve magnetic device according to the invention.

FIG. 5 shows a detailed diagram of the spin valve magnetic device 110 according to the invention. The accessory layers, such as substrate 114 and the other layers 112A, 115, 116, 117, as in FIGS. 4A and 4B, are not shown for the sake of simplicity.

The spin valve 110 therefore comprises the free magnetic layer 111 and the permanent magnetic layer 112 respectively made of a hard magnetic material and a soft magnetic material.

The spacer layer 123 instead is of the composite mesoscopic type, in which nanoparticles 124 are dispersed in a matrix structure 125.

The spin valve 120 shown in FIG. 5 is particularly suitable for a GMR sensor, so the spacer layer 123 is obtained with a composite mesoscopic structure, in which the nanoparticles 124 made of metal, but also possibly of ferromagnetic and/or dielectric and/or ceramic and/or semiconductor material, are dispersed in the matrix structure 125 with a thickness ranging from a few angstrom to hundreds of nanometres. Such a structure of the spacer layer 113 allows to control the electronic scattering properties and to control the reference electrical resistance of the device in the absence of magnetic field and of the dynamic work field.

Figure 6:
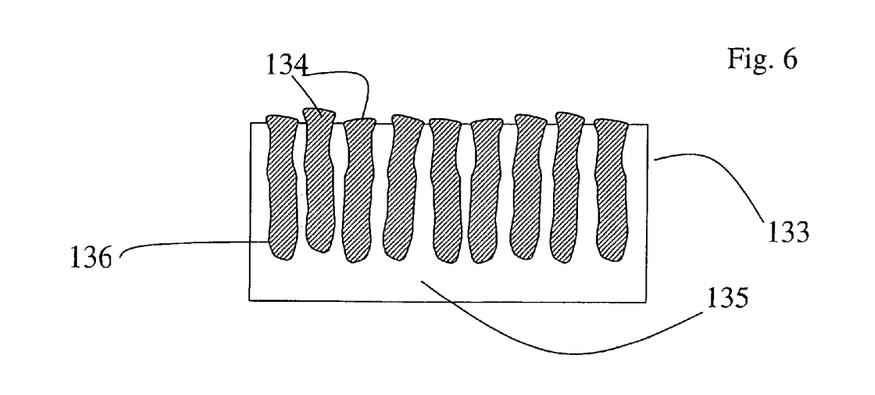
FIG. 6 shows a schematic diagram of a detail of the spin valve magnetic device of FIG. 5.

If a TMR spin valve has to be obtained, the spacer layer 133, shown in FIG. 6, is preferably constituted by a dielectric layer comprising insertions of clusters of metallic, ferromagnetic, semiconductor or other dielectric atoms. A dielectric spacer layer with mesoscopic structure allows to control electronic tunnelling properties through the mesoscopic layer of the device responsible for its resistivity and hence the reference electrical resistance of the device in the absence of magnetic field and of the dynamic work field.

The spacer layer 123 or 133, both in the GMR case and in the TMR case, can be obtained by simultaneous plating of one or more elements by thermal co-evaporation, electron-beam, CVD, PECVD, sputtering and/or continuous or pulsed electrodeposition, simple precipitation, centrifuging or serigraphy.

The spacer layer 133 shown in FIG. 6, in particular, is obtained by a method that provides for filling, by simultaneous deposition, electron-beam, CVD, PECVD, sputtering and/or continuous or pulsed electrodeposition, simple precipitation, centrifuging or serigraphy, matrices of nano-porous materials obtained by electrochemical self-assembly, such as anodised alumina or porous silicon.

In particular, FIG. 6 shows the spacer layer 133, which comprises a matrix of porous alumina 135, provided with pores 136, in which are deposited by electroplating metallic nanoparticles 134 in column structure or nanorods.

In a preferred version, the spacer layer 133 is obtained according to the methods of FIGS. 1, 2A, 2B and 2C.

The solution described above allows to achieve considerable advantages with respect to prior art solutions.

A method is proposed for manufacturing magnetic field detection devices, equipped with a magnetoresistive element comprising regions with metallic conduction and regions with semiconductive conduction, which advantageously provides for adopting a disordered mesoscopic structure, with separate preparation of metallic nanoparticles and subsequent application to a semiconductor substrate with simple and economical processes.

Naturally, without altering the principle of the invention, the construction details and the embodiments may vary widely from what is described and illustrated purely by way of example herein, without thereby departing from the scope of the present invention.

In a possible variant to the proposed manufacturing method, to obtain a magnetoresistive element with a disordered mesoscopic structure comprising semiconductive areas and metallic areas having different conduction properties according to the applied magnetic field, by virtue of the generation of a spatial charge zone in the metallic area because of the Lorentz force, to co-evaporate said metallic nanoparticles within the scope of a growth process of a semiconductor substrate. For example, it is possible to co-evaporate gold particles during the process of growing a substrate of indium antimonide by Chemical Vapour Deposition or sputtering.

A device obtained with the described method can be used as a magnetic field sensor or magnetic switch, as an electromagnetic radiation sensor, as an electromagnetic radiation emitter, as a photovoltaic cell, and as a thermophotovoltaic cell.

The spin valve device described herein, moreover, advantageously allows to control the electronic scattering properties of the device responsible for its resistivity, through an appropriate selection of the type of mesoscopic structure to be laid, both with respect to the matrix and with respect to the nanoparticles included in the matrix. A spacer layer thus conceived allows to control and change the reference electrical resistance of the device in the absence of magnetic field and of the dynamic work field. Moreover, the characteristics of the spacer layer can advantageously be studied and regulated operating on a multiplicity of composition parameters, in order simultaneously to obtain high sensitivity.

The invention claimed is:

1. A method for manufacturing magnetic field detection devices, said method comprising the operations of manufacturing a magneto-resistive element comprising regions having metallic conduction and regions having semi-conductive conduction wherein said method comprises the following operations:
    forming metallic nanoparticles to obtain said regions with metallic conduction;
    providing a semiconductor substrate;
    applying said metallic nanoparticles to said semiconductor substrate to obtain a disordered mesoscopic structure; and
    wherein said semiconductor substrate is subjected to a chemical etching process to form pores in said semiconductor substrate.

2. Method as claimed in claim 1, wherein said metallic nanoparticles are applied to said semiconductor substrate, introducing said nanoparticles in a solution and applying said solution to said substrate.

3. Method as claimed in claim 2, wherein the method is employed in a process of capillary condensation of said solution in the pores of said semiconductor substrate to obtain said metallic regions.

4. Method as claimed in claim 2, wherein the method is employed in a process of electrochemical deposition in the pores of said semiconductor substrate to obtain said metallic regions.

5. Method as claimed in claim 1, to perform said chemical etching process of the semiconductor substrate, to said substrate is applied a porous template, in particular a template of porous alumina.

6. Method as claimed in claim 5, wherein said chemical etching uses an electrolytic solution able to etch said semiconductor substrate and that said electrochemical solution is progressively replaced by the solution containing metallic nanoparticles always leaving the surface of the semiconductor substrate immersed, to prevent ambient air or gas from penetrating in said pores.

7. A method as claimed in claim 1, wherein the method further comprises a step of thermal annealing of said magnetoresistive element to create nanorods in said pores.

8. Method as claimed in claim 1, wherein in said step of providing a semiconductor substrate, said substrate is grown with a growth process and the step of applying said metallic nanoparticles provides for co-evaporating said particles during said process of growing said substrate.

9. Method as claimed in claim 8, wherein said growth process is a sputtering process.

10. Method as claimed in claim 8, wherein said growth process is a Chemical Vapour Deposition process.

11. Method as claimed in claim 1, wherein said substrate of semiconductor material is obtained by means of a semiconductor selected among silicon, germanium, indium antimonide, mercury telluride, indium arsenide, carbon titanate, gallium arsenide, silicon carbide, gallium phosphide, gallium nitride and alumina.

12. Method as claimed in claim 1, wherein in that said metallic nanoparticles are of a metallic material selected among gold, silver, aluminium, gallium, indium, copper, chrome, tin, nickel, iron, platinum, palladium, cobalt, tungsten, molybdenum, tantalum, titanium, permalloy.

13. A method as claimed in claim 1 wherein said semiconductor substrate is laid on another insulating substrate.

14. Method as claimed in claim 1, wherein said chemical etching process to form pores in the semiconductor substrate forms through pores.

15. A device for detecting magnetic fields, of the type comprising a magnetoresistive element able to vary its resistance upon application of a magnetic field, wherein said magnetoresistive element is manufactured according to the method as claimed in claim 1.

16. Device as claimed in claim 15, wherein said electrodes are applied to the lateral surfaces of said magnetoresistive element to apply a current (I).

\* \* \* \* \*